(12) United States Patent
Yoon et al.

(10) Patent No.: US 8,358,533 B2
(45) Date of Patent: Jan. 22, 2013

(54) PHASE-CHANGE MEMORY DEVICE

(75) Inventors: Tae Hoon Yoon, Seoul (KR); Hyuck Soo Yoon, Cheongju (KR)

(73) Assignee: Hynix Semiconductor Inc., Icheon (KR)

( * ) Notice: Subject to any disclaimer, the term of this patent is extended or adjusted under 35 U.S.C. 154(b) by 188 days.

(21) Appl. No.: 12/834,678

(22) Filed: Jul. 12, 2010

(65) Prior Publication Data

US 2011/0292720 A1   Dec. 1, 2011

(30) Foreign Application Priority Data

May 27, 2010  (KR) .................. 10-2010-0049659

(51) Int. Cl.
*G11C 11/00* (2006.01)
*G11C 5/14* (2006.01)
(52) U.S. Cl. .................. 365/163; 365/148; 365/227
(58) Field of Classification Search .................. 365/163
See application file for complete search history.

(56) References Cited

U.S. PATENT DOCUMENTS

| 7,283,387 | B2* | 10/2007 | Cho et al. | 365/163 |
|---|---|---|---|---|
| 7,391,644 | B2* | 6/2008 | Cho et al. | 365/163 |
| 7,417,887 | B2* | 8/2008 | Cho et al. | 365/148 |
| 7,457,151 | B2* | 11/2008 | Cho et al. | 365/163 |
| 7,679,955 | B2* | 3/2010 | Cho | 365/177 |
| 7,817,479 | B2* | 10/2010 | Ro et al. | 365/189.09 |
| 7,835,199 | B2* | 11/2010 | Choi et al. | 365/189.09 |
| 7,843,720 | B2* | 11/2010 | Kim et al. | 365/163 |
| 8,023,320 | B2* | 9/2011 | Kim et al. | 365/163 |
| 2007/0103972 | A1* | 5/2007 | Ro et al. | 365/163 |
| 2011/0182114 | A1* | 7/2011 | Em et al. | 365/163 |

FOREIGN PATENT DOCUMENTS

| KR | 1020040006674 A | 1/2004 |
|---|---|---|
| KR | 1020060101695 A | 9/2006 |

* cited by examiner

*Primary Examiner* — Son Mai

(57) ABSTRACT

A phase-change memory device includes: a unit cell including a phase-change resistor; a sense amplifier applying a sensing current to the phase-change resistor; and a switching unit operating in a standby mode or a read mode according to a global line signal and controlling passing presence of the sensing current passing through the phase-change resistor according to an active signal in the standby mode.

30 Claims, 13 Drawing Sheets

PHASE-CHANGE MEMORY DEVICE

CROSS-REFERENCES TO RELATED APPLICATIONS

The embodiment of present application claims priority to Korean patent application number 10-2010-0049659, filed on 27 May 2010, which is incorporated by reference in its entirety.

BACKGROUND OF THE INVENTION

The embodiment of present invention relates to a phase-change memory device.

Phase-change memory devices have a nonvolatile characteristic, and thus maintain data stored therein even if power is interrupted. Furthermore, although they are nonvolatile memory, the phase-change memory devices have a data processing speed of a random access memory (RAM) device.

FIG. 1a and FIG. 1b are views illustrating a phase-change resistor 4 included in a phase-change memory device. Referring to FIG. 1a and FIG. 1b, the phase-change resistor 4 is composed of an upper electrode 1, a lower electrode 3, and a phase-change material 2 sandwiched between the upper electrode 1 and the lower electrode 3. When a voltage is applied to the upper electrode 1 and the lower electrode 3, an electric current flows through the phase-change material 2 to change a temperature thereof, and thus an electric conductive state is changed.

FIG. 2a and FIG. 2b are views illustrating a data storage principle of the phase-change resistor 4 shown in FIGS. 1a and 1b. If an electric current less than a threshold value flows through the phase-change resistor 4, the phase-change material 2 is crystallized. When the phase-change material 2 is crystallized, it lowers the resistance of the material. As a result, an electric current can flow between the upper electrode 1 and the lower electrode 3.

Meanwhile, referring to FIG. 2b, if an electric current equal to or greater than the threshold value flows through the phase-change resistor 4, the temperature of the phase-change material 2 rises above its melting point. When the phase-change material 2 melts into an amorphous phase, it becomes a material having high resistance. As a result, it is difficult for an electric current to flow between the upper electrode 1 and the lower electrode 3.

Accordingly, the phase-change resistor 4 may store a 1-bit data corresponding to the forgoing two states. For example, the phase-change resistor 4 can use a low resistance state to represent data of logic '1' and a high resistance state to represent data of logic '0'. Furthermore, because the state of the phase-change material 2 does not vary even when the phase-change memory device is not powered, the data can be stored in a nonvolatile pattern.

FIG. 3 is a graph illustrating a write operation of a phase-change resistive cell including the phase-change resistor 4. Referring to FIG. 3, when an electric current flows between the upper electrode 1 and the lower electrode 3 of the phase-change resistor 4 for a predetermined time, heat is generated. When an electric current less than a threshold value flows for a predetermined time, the phase-change material 2 is crystallized under a low temperature heating condition. Consequently, the phase-change resistor 4 becomes a set state.

Conversely, when an electric current equal to or greater than the threshold value flows through the phase-change resistor 4, the phase-change material 2 becomes an amorphous state under a high temperature heating condition. As a result, the phase-change resistor 4 becomes a reset state.

To write the set state in the write operation through the use of the above features, a low voltage is applied to the phase-change resistor 4 for a long time.

Conversely, to write the reset state in the write operation, a high voltage is applied to the phase-change resistor 4 for a short time.

Meanwhile, during a sensing operation, a sensing current is provided to the phase-change resistor 4, thereby sensing data written in the phase-change resistor 4.

BRIEF SUMMARY OF THE INVENTION

Embodiments of the present invention are directed to a phase-change memory device that may prevent a leakage current from being generated while read/write operations are not performed.

According to an embodiment of the present invention, a phase-change memory device includes: a unit cell including a phase-change resistor; a sense amplifier applying a sensing current to the phase-change resistor; and a switching unit operating in a standby mode or a read mode according to a global line signal and controlling passing presence of the sensing current passing through the phase-change resistor according to an active signal in the standby mode.

Embodiments of the present invention may prevent a leakage current from be generated in a standby mode where read/write operations are not performed in a semiconductor memory device.

DESCRIPTION OF EMBODIMENTS

Hereinafter embodiments of the present invention are described in detail with reference to the accompanying drawings.

Figure 1A:
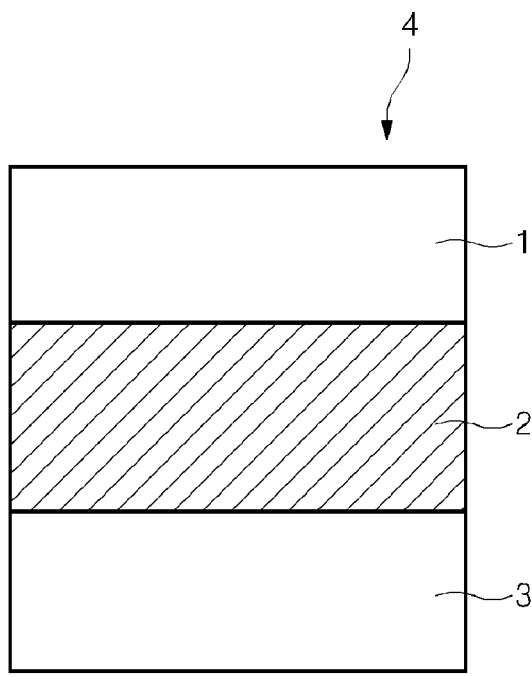
FIG. 1a and FIG. 1b are views illustrating a phase-change resistor.
Figure 1B:
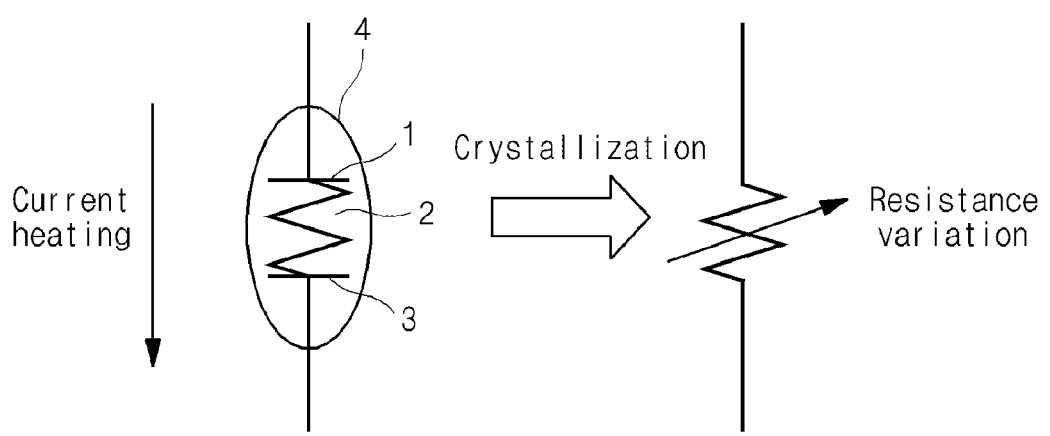
Figure 2A:
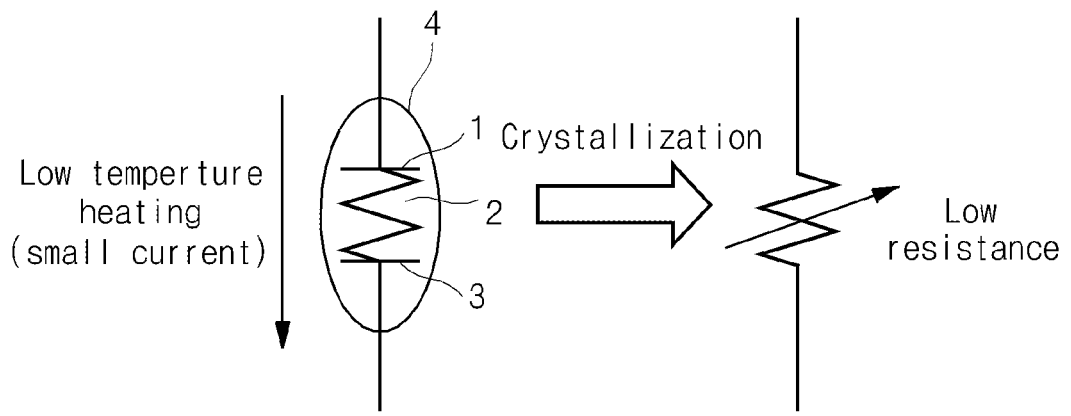
FIG. 2a and FIG. 2b are views illustrating a data storage principle of the phase-change resistor shown in FIGS. 1a and 1b.
Figure 2B:
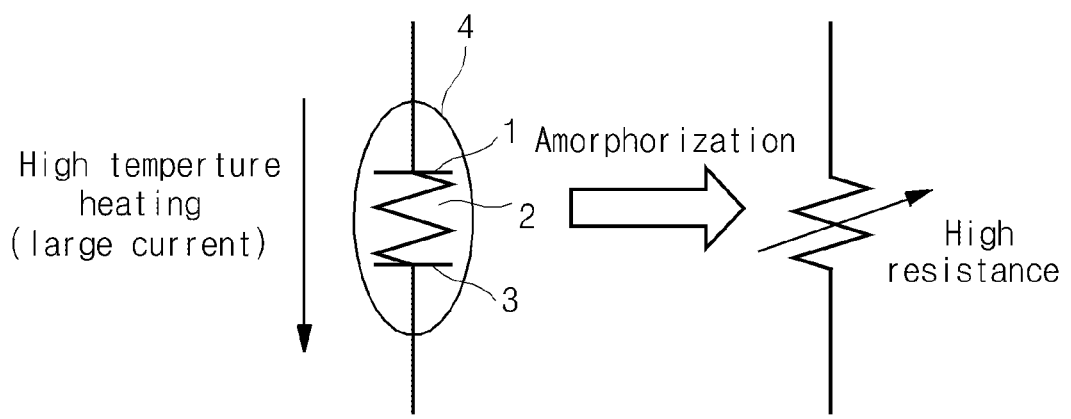
Figure 3:
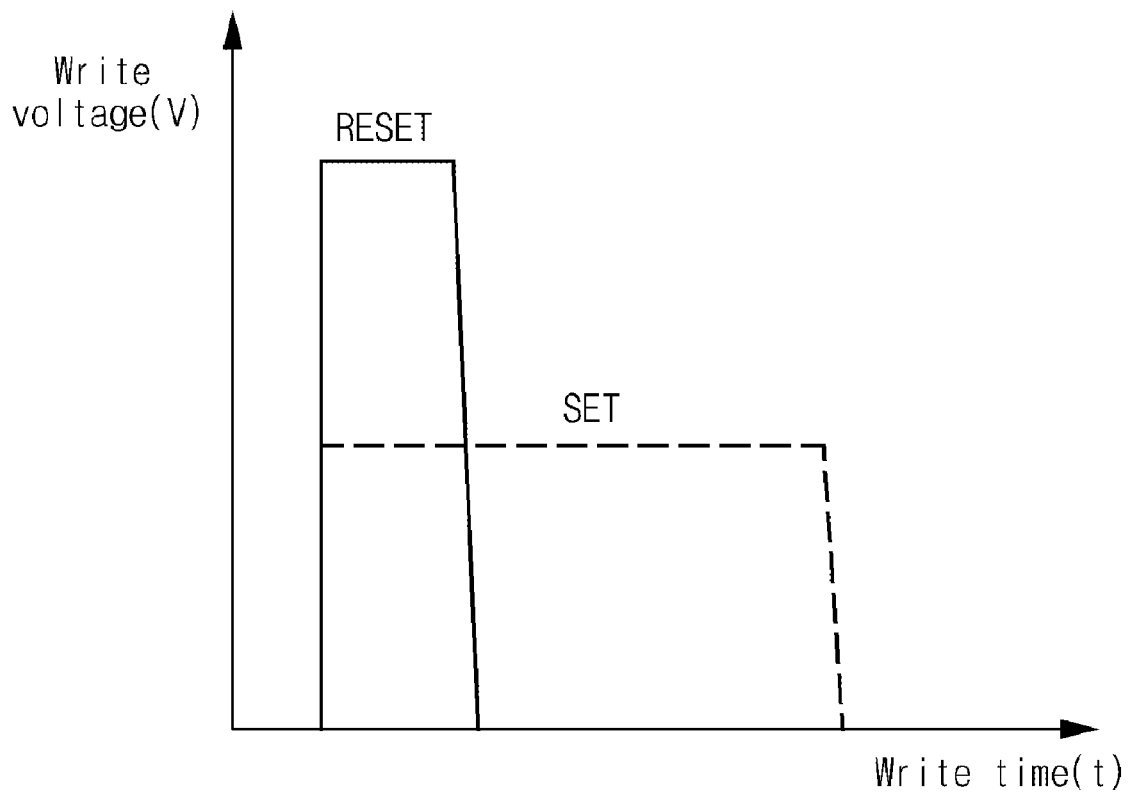
FIG. 3 is a graph illustrating a write operation of a phase-change resistive cell.
Figure 4:
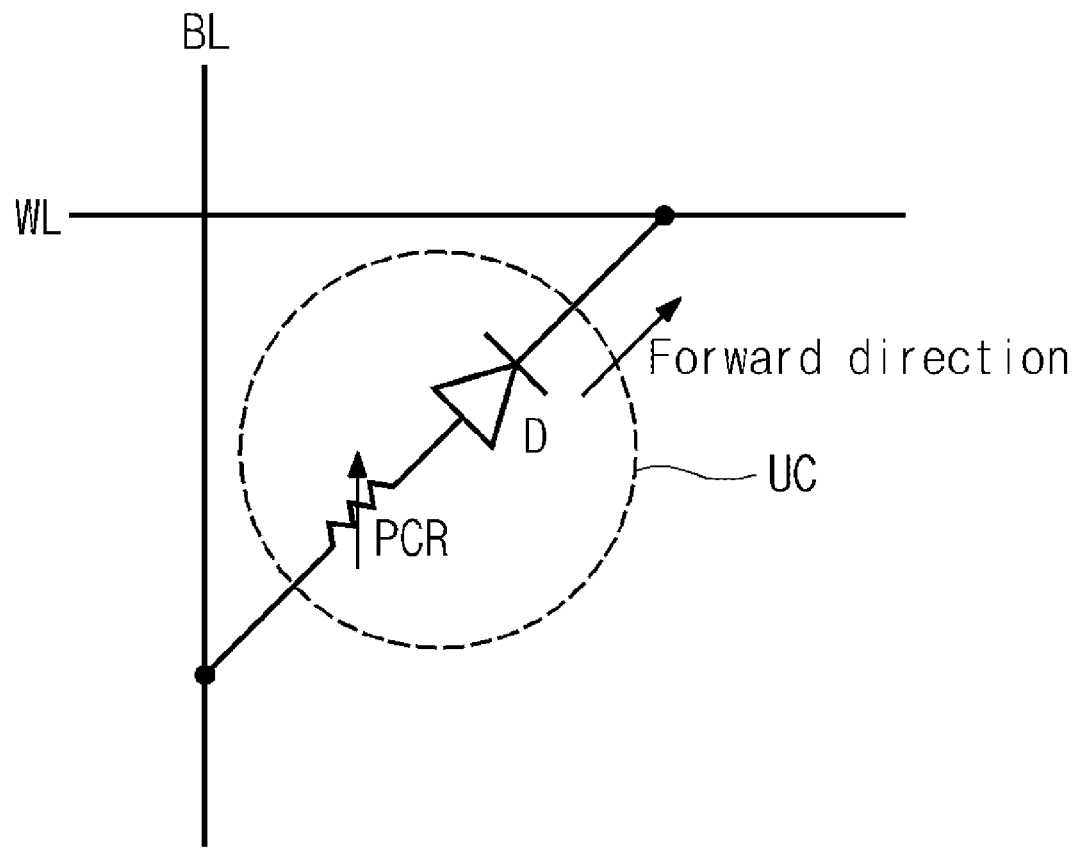
FIG. 4 is a view illustrating a unit cell of a phase-change memory device according to an embodiment of the present invention.

FIG. 4 is a view illustrating a unit cell of a phase-change memory device according to an embodiment of the present invention.

Referring to FIG. 4, the phase-change memory device includes a word line WL and a bit line BL that intersect each other. A unit cell UC is disposed at an intersection of the word line WL and the bit line BL. The unit cell UC includes a phase-change resistor PCR and a switch element. For example, the switch element may be a diode D.

In the unit cell UC, one terminal of the phase-change resistor PCR may be connected to the bit line BL, one terminal of the switch element may be connected to the other terminal of the phase-change resistor PCR, the word line WL may be connected to the other terminal of the switch element. Meanwhile, in accordance with another embodiment of the present invention, in the unit cell UC, one terminal of the switch element may be connected with the bit line BL, one terminal of the phase-change resistor PCR may be connected with the other terminal of the switch element, and the word line WL may be connected with the other terminal of the phase-change resistor PCR.

The switch element controls an electric current to flow from the bit line BL to the word line WL but not to flow in an opposite direction thereof. For example, when the switch element includes the diode D, the diode D can be provided to make a direction from the bit line BL to the word line WL being a forward direction. In this case, an electric current cannot flow from the word line WL to the bit line BL due to a characteristic of the diode D.

Figure 5:
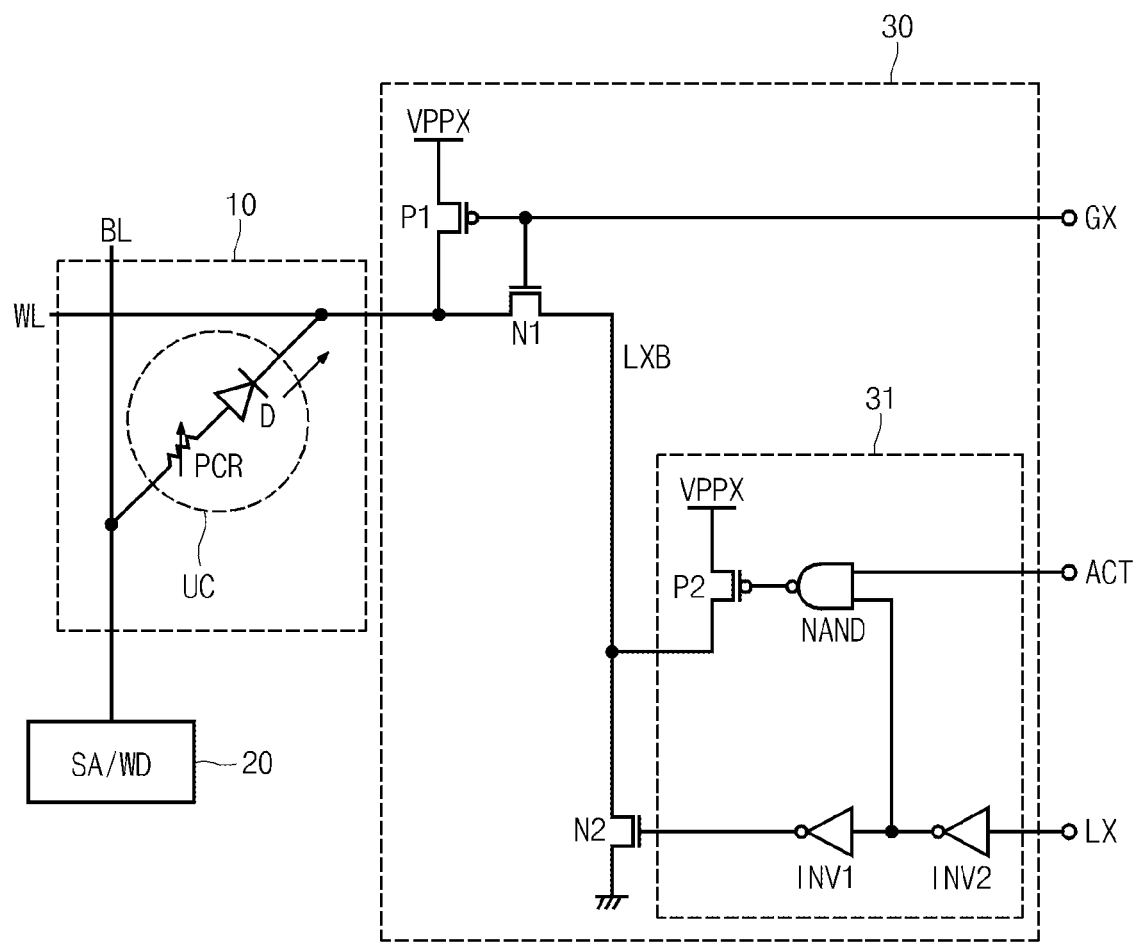
FIG. 5 is a circuit diagram illustrating a phase-change memory device according to an embodiment of the present invention.

FIG. 5 is a circuit diagram illustrating a phase-change memory device according to an embodiment of the present invention. Referring to FIG. 5, the phase-change memory device includes a cell array 10, a sense amplifier/write driving unit 20, and a switching unit 30.

The cell array 10 may include at least one unit cell UC. One unit cell UC is shown in FIG. 5. In the cell array 10, the bit line BL and the word line WL intersect each other. The unit cell UC is disposed at the intersection of the bit line BL and the word line WL. Connection relationships of the unit cell UC, the bit line BL and the word line WL are the same as those in FIG. 4.

The sense amplifier/write driving unit 20 supplies a sensing current or a write current to the cell array 10 through the bit line BL. During a read operation, the sense amplifier 20 provides the sensing current to the cell array 10 to read out data stored in the phase-change resistor PCR of the unit cell UC.

The phase-change resistor PCR has a resistance state corresponding to a stored data value. For example, a high resistance state may correspond to data of logic "1", and a low resistance state may correspond to data of logic "0".

When the sensing current applied by the sense amplifier 200 passes through the phase-change resistor PCR, a sense voltage is induced corresponding to a resistance value of the phase-change resistor PCR. Then, the sense amplifier 20 may discriminate which data is stored in the phase-change resistor PCR by detecting the sense voltage.

In the same manner, during a write operation, the write driving unit 20 supplies the write current to the cell array 10 to write data into the phase-change resistor PCR of the unit cell UC. The phase-change resistor PCR has a resistance state corresponding to a stored data value. For example, a high resistance state may correspond to data of logic "1", and a low resistance state may correspond to data of logic "0".

The write driving unit 20 provides the write current to the phase-change resistor PCR to place the phase-change resistor PCR in a high resistance state or a low resistance state. Consequently, data corresponding to the resistance state may be written into the phase-change resistor PCR.

The switching unit 30 includes a power source voltage supply element, a first switch element, a second switch element, and a controller 31.

The power source voltage supply element may supply a power source voltage VPPX to the word line WL according to a global line signal. For example, the power source voltage supply element may include a PMOS transistor P1.

The power source voltage VPPX may be supplied to a source of the PMOS transistor P1, a drain of the PMOS transistor P1 may be connected to the word line WL, and a gate thereof may be connected to a global line GX. The PMOS transistor P1 is turned-on or turned-off according to a voltage level of the global line signal input to the gate thereof.

When the power source voltage supply element is turned-on, the power source voltage VPPX is supplied to the word line WL. The power source voltage VPPX may have a voltage level higher than that of a voltage supplied to an output terminal of the sense amplifier/write driving unit 20.

Therefore, if the power source voltage VPPX is supplied to the word line WL, although the sensing current or the write current is supplied to the cell array 10, a current path is not formed in the cell array 10. In this case, because a voltage level of the word line WL is higher than that of the output terminal of the sense amplifier/write driving unit 20, an electric current can be applied from the word line WL to the unit cell UC. However, because the diode D interrupts a backward current, it may prevent an electric current from entering into the phase-change resistor PCR and the sense amplifier/write driving unit 20.

One terminal of the first switch element is connected with the unit cell UC, and the other terminal thereof is connected with a local line LXB. A switching operation of the first switch element is controlled according to the global line signal applied through the global line GX.

For example, the first switch element may include an NMOS transistor N1. A drain of the NMOS transistor N1 is connected to the unit cell UC, a source thereof is connected to the local line LXB, and a gate thereof is connected to the global line GX. The NMOS transistor N1 is turned-on or turned-off according to the voltage level of the global line signal input to the gate thereof.

If the first switch element is turned-on, the sensing current or the write current provided from the sense amplifier/write driving unit 20 passes through the unit cell UC and flows to the local line LXB via the first switch element.

Conversely, if the first switch element is turned-off, although the sensing current or the write current provided from the sense amplifier/write driving unit 20 passes through the unit cell UC, the current cannot pass through the first switch element, so that a current path cannot be formed from the unit cell UC to the local line LXB.

Namely, in read/write modes, the global line signal is activated to form a sensing current path or a write current path. In this case, the power source voltage VPPX is not supplied to the word line WL. In the meantime, in a standby mode, the global line signal may be deactivated to prevent the sensing current or the write current from flowing through the cell array 10. In this case, since the power source voltage VPPX is supplied to the word line WL, it can cut off the flow of the sensing current or write current into an input terminal of the first switch element.

Meanwhile, the second switch element can be connected between the first switch element and a ground terminal. A switching operation of the second switch element is controlled according to a local line control signal LX. For example, the second switch element may include an NMOS transistor N2. A drain of the NMOS transistor N2 is connected to the source of the NMOS transistor N1, a source thereof is connected to the ground terminal, and the local line control signal LX may be input to a gate thereof. The NMOS transistor N2 is turned-on or turned-off according to a voltage level of the local line control signal LX.

If the second switch element is turned-on, the sensing current or the write current provided from the sense amplifier/write driving unit 20 passes through the unit cell UC and the first switch element, and flows to the ground terminal via the second switch element. Conversely, if the second switch element is turned-off, although the sensing current or the write current provided from the sense amplifier/write driving unit 20 passes through the unit cell UC and the first switch element, it does not pass through the second switch element. Accordingly, a current path cannot be formed.

Accordingly, although the first switch element is turned-on in the read/write modes to input the sensing current or the write current to the drain of the second switch element, the second switch element can selectively flow the sensing current or the write current to the ground terminal.

For example, in a case where a plurality of unit cells UC are included in the cell array 10, only a second switch element connected to a specific unit cell UC may be turned-on according to a corresponding local line control signal LX in the read/write modes. As a result, read/write operations on the specific unit cell UC among the plurality of unit cells UC may be selectively performed. A detailed application of the second switch element will be described in the description of a phase-change memory device according to another embodiment of the present invention to be explained later.

The controller 31 may float an output terminal of the first switch element or supply the power source voltage VPPX to the output terminal of the first switch element according to an active signal ACT. If the active signal ACT is deactivated, the controller 31 may float the output terminal of the first switch element.

When the phase-change memory device according to this embodiment of the present invention is in a standby mode, the output terminal of the first switch element may be in a floating state to prevent a leakage current from being generated in the first switch element. A detailed procedure for preventing the generation of the leakage current will be explained with reference to FIG. 7 and FIG. 8.

If the active signal ACT is activated, the controller 31 may supply the power source voltage VPPX to the output terminal of the first switch element. The power source voltage VPPX may have a voltage level higher than that of the voltage supplied from the output terminal of the sense amplifier/write driving unit 20. When the power source voltage VPPX is supplied to the output terminal of the first switch element, although the sensing current or the write current is supplied to the input terminal of the first switch element, a current path is not formed.

If the second switch element is turned-off, an electric current does not fundamentally flow from the first switch element to the ground terminal. However, in practice, a leakage current can occur in the second switch element. The power source voltage VPPX may be supplied to the output terminal of the first switch element to fundamentally prevent such a leakage current from being generated. In this case, because the voltage level of the output terminal of the first switch element is higher than that of the input terminal thereof, an electric current may be applied to the unit cell UC through the word line WL. However, because the diode D intercepts a backward current, it can prevent the electric current from flowing into the phase-change resistor PCR and the sense amplifier/write driving unit 20.

Figure 6:
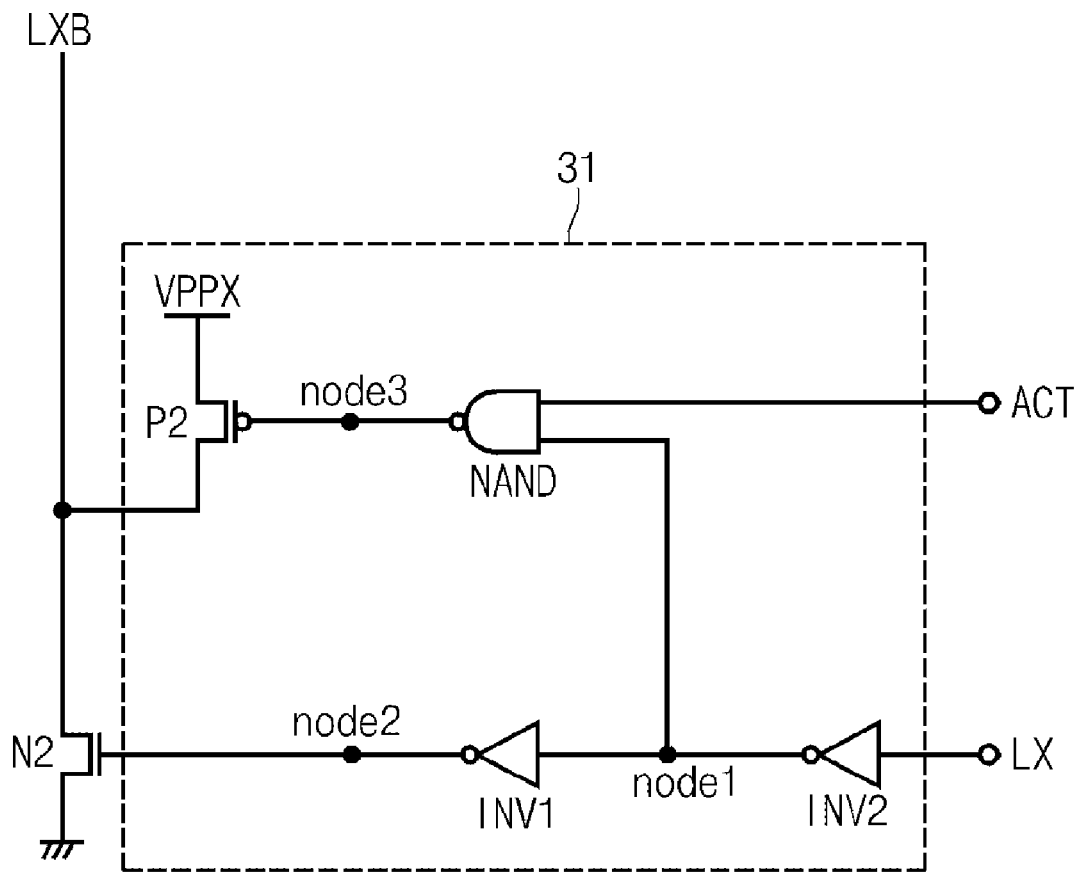
FIG. 6 is a circuit diagram illustrating a controller of the phase-change memory device shown in FIG. 5.

FIG. 6 is a circuit diagram illustrating the controller 31 of the switching unit 30 in the phase-change memory device shown in FIG. 5. Referring to FIG. 6, the controller 31 includes a second PMOS transistor P2, a logic element NAND, a first inverter INV1, and a second inverter INV2.

The power source voltage VPPX is supplied to a source of the second PMOS transistor P2, a drain thereof is connected with the output terminal of the first switch element (input terminal of the second switch element), and a gate thereof receives an output signal of the logic element NAND.

The logic element NAND receives the active signal ACT and an inverting signal of the local line control signal LX, and performs a logical operation on the active signal ACT and the inverting signal. For example, the logic element NAND may perform an NAND logic operation. The local line control signal LX may be inverted twice by the first inverter INV1 and the second inverter INV2 to be input to the gate of the second switch element, e.g., the second NMOS transistor N2.

The following is a detailed description for an operation of the controller 31. For example, if the active signal ACT is deactivated to a low level, the logic element NAND outputs a high level signal to a node 3 regardless of the local line control signal LX. Accordingly, the second PMOS transistor P2 is turned-off.

It is assumed that the active signal ACT is deactivated in a standby mode. Since read/write operations are not achieved in the standby mode, the local line control signal LX for selecting a unit cell UC is input with a low level. Consequently, the second NMOS transistor N2 is turned-off. As a result, the controller 31 floats the output terminal of the first switch element (input terminal of the second switch element).

Meanwhile, if the active signal ACT is activated to a high level, the logic element NAND outputs a signal to the node 3 according to the local line control signal LX. If the local line control signal LX of a high level is input, a high level signal is output to the node 3 to thereby turn-off the second PMOS transistor P2. However, in this case, the second NMOS transistor N2 is turned-on in response to the local line control signal LX having the high level. As a result, an electric current input from the first switch element passes through the second switch element, i.e., the NMOS transistor N2, and flows to the ground terminal.

In the meantime, if the local line control signal LX of a low level is input, a low level signal is output to the node 3 to thereby turn-on the second PMOS transistor P2, whereas the second NMOS transistor N2 is turned-off in response to the local line control signal LX of the low level. As a result, the power source voltage VPPX is supplied to the output terminal of the first switch element.

The foregoing input/output relationship is summarized in Table 1.

TABLE 1

| Local Line Control Signal LX | Active Signal ACT | Local Line LXB | Mode | Selected or Unselected |
|---|---|---|---|---|
| Low | Low | Floating | Standby | Unselected |
| Low | High | VPPX | Read/Write | Unselected |
| High | High | VSS | Read/Write | Selected |

Figure 7:
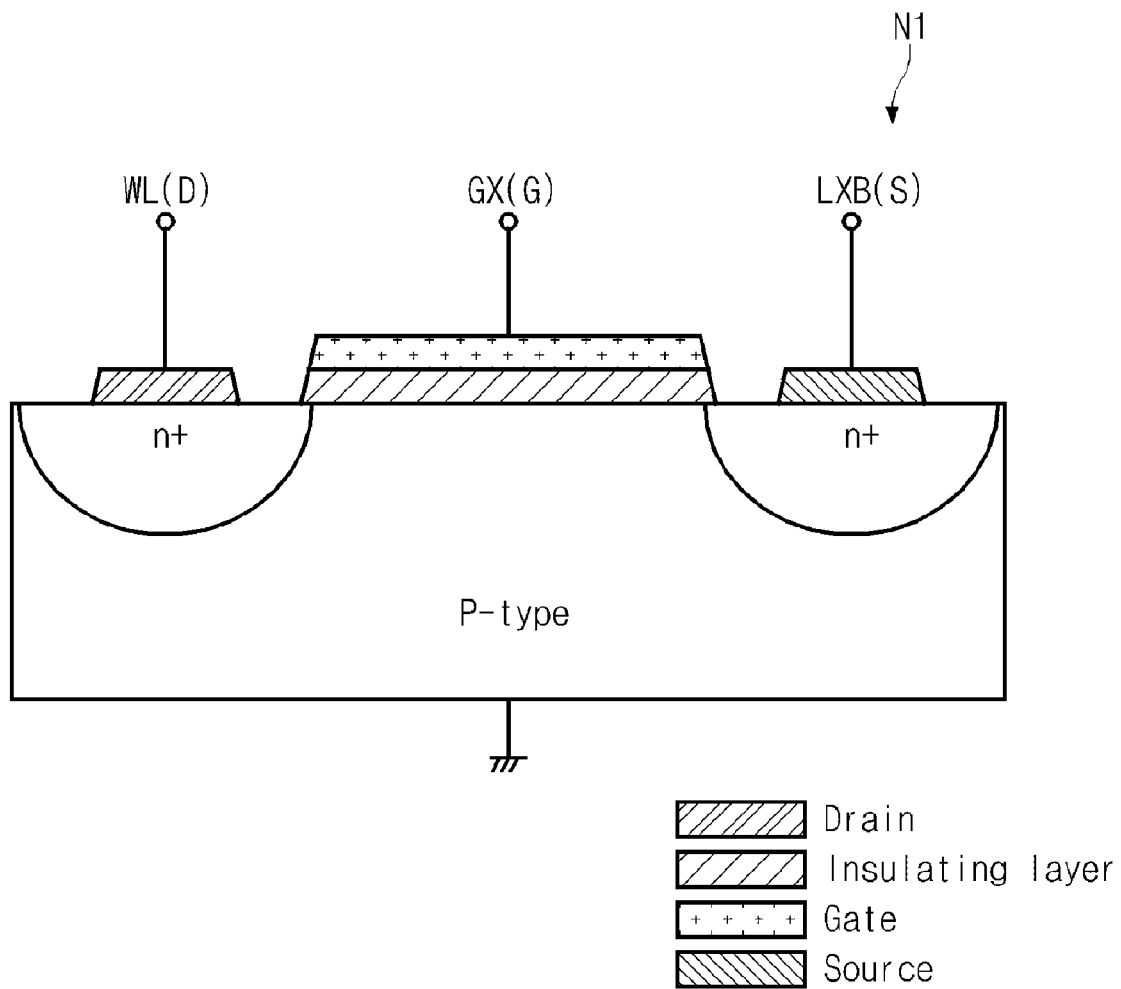
FIG. 7 is a view illustrating a first switch element of a phase-change memory device according to an embodiment of the present invention.

FIG. 7 is a view illustrating a first switch element of a phase-change memory device according to an embodiment of the present invention. Referring to FIG. 7, the first switch element may be an NMOS transistor N1.

In the NMOS transistor N1, an n+ type well is formed in a p type substrate. A drain region and a source region are formed in the n+ type well. An insulating layer is formed on the p type substrate between the drain region and the source region, and a gate region is formed on the insulating layer.

In the phase-change memory device according to this embodiment of the present invention, the drain region of the NMOS transistor N1 is connected with a word line WL through a drain electrode D. The source region of the NMOS transistor N1 is connected with a local line LXB through a source electrode S, and the gate region is connected with a global line GX through a gate electrode G.

Figure 8A:
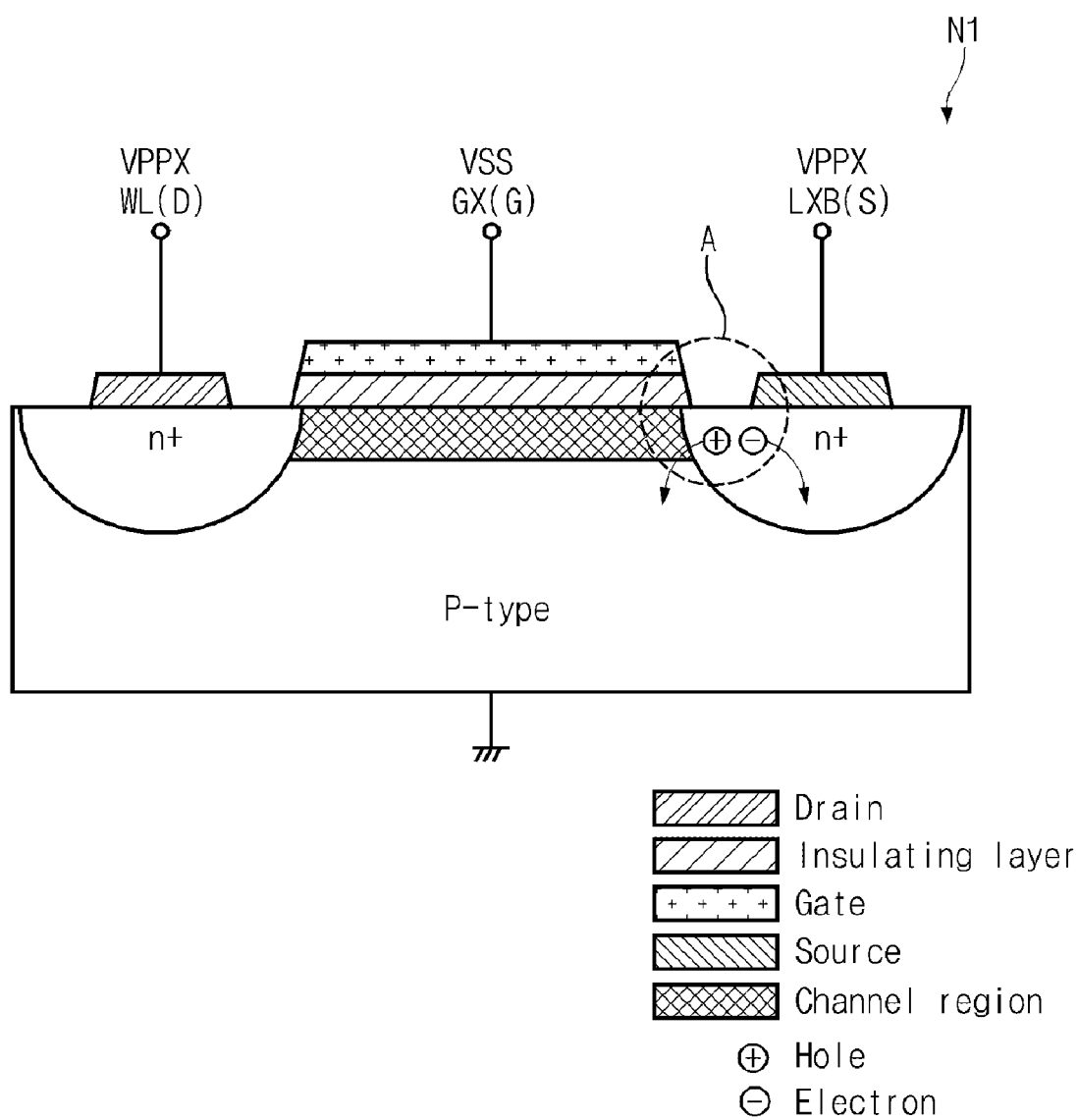
FIG. 8a is a view illustrating the first switch element shown in FIG. 7 when a power source voltage is supplied to a source thereof.

FIG. 8a is a view illustrating the first switch element shown in FIG. 7 when a power source voltage VPPX is supplied to the source S thereof. Referring to FIG. 8a, the power source voltage VPPX is supplied to the source S of the first switch element in the phase-change memory device, and a ground voltage VSS is supplied to the gate G thereof. In this case, because the source S of the first switch element has a voltage greater than that of the gate G thereof, a region A becomes a depletion region. Namely, holes are pushed to a direction of the substrate by the power source voltage VPPX, and electrons are pulled to the inside of the source region by the power source voltage VPPX. Accordingly, a leakage current occurs from the drain D to a direction of the substrate.

Figure 8B:
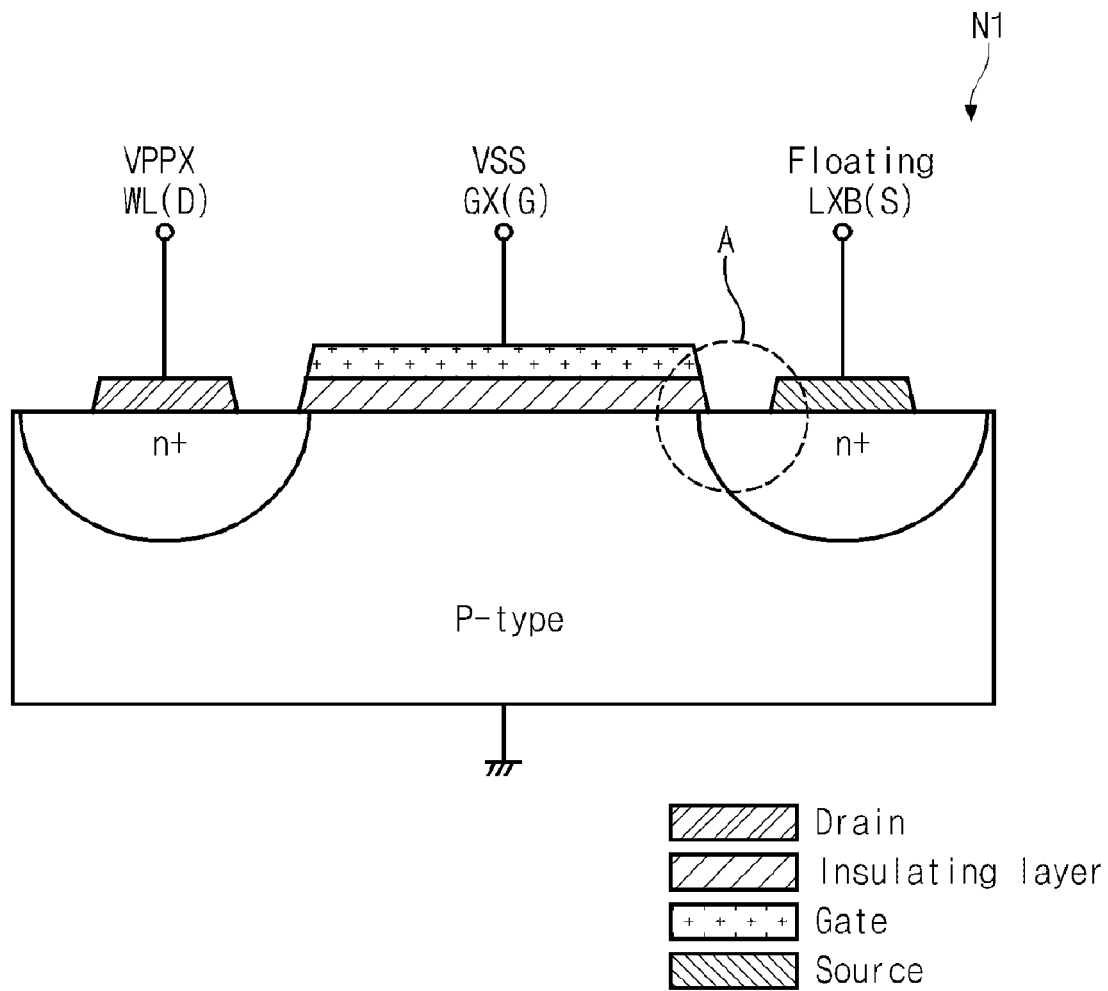
FIG. 8b is a view illustrating the first switch element shown in FIG. 7 when the source thereof is floated.

FIG. 8b is a view illustrating the first switch element shown in FIG. 7 when the source S thereof is floated. Referring to FIG. 8b, the source S of the first switch element is floated, and the ground voltage VSS is supplied to the gate G thereof. In this case, because an electric current does not flow through the floated source region, the leakage current mentioned in FIG. 8a does not occur.

The phase-change memory device according to this embodiment of the present invention uses a principle where a leakage current does not occur when the source of the first switch element is floated. The phase-change memory device according to this embodiment of the present invention floats the source of the first switch element in a standby mode in which the leakage current readily occurs.

Referring to the foregoing Table 1, in the phase-change memory device according to this embodiment of the present invention, when a unit cell UC is not selected in the read/write modes, the power source voltage VPPX is supplied to the local line LXB. In this case, as shown in FIG. 8a, the power source voltage VPPX is supplied to the source of the first switch element. In the read/write modes, the power source voltage VPPX is supplied to the source of the first switch element to perform the read/write operations on only a selected unit cell UC. Accordingly, a leakage current inevitably occurs.

However, in the standby mode, since performing the read/write operations is unnecessary, there is no need to supply the power source voltage VPPX to the source of the first switch element. Referring to Table 1, the phase-change memory device according to this embodiment of the present invention floats the local line LXB in the standby mode. As a result, it can prevent a leakage current from occurring in the first switch element in the standby mode.

Figure 9:
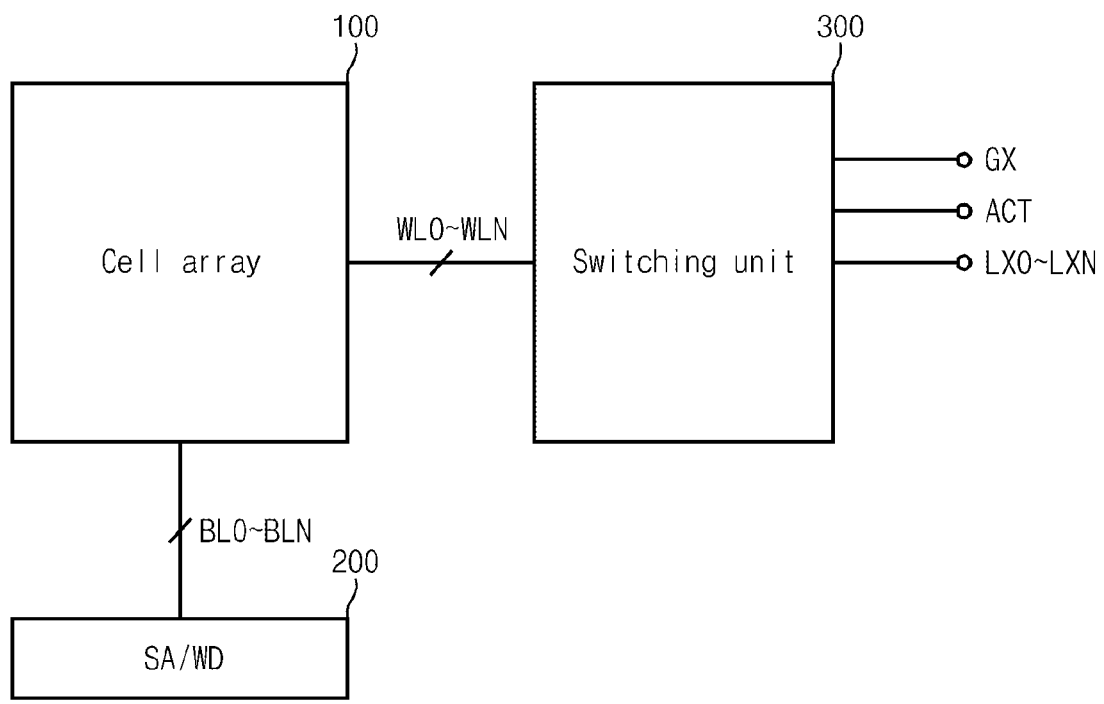
FIG. 9 is a block diagram illustrating a phase-change memory device according to an embodiment of the present invention.

FIG. 9 is a block diagram illustrating a phase-change memory device according to an embodiment of the present invention. Referring to FIG. 9, the phase-change memory device includes a cell array 100, a sense amplifier/write driving unit 200, and a switching unit 300.

The cell array 100 may include a plurality of unit cells UC. The sense amplifier/write driving unit 200 supplies a sensing current or a write current to the cell array 100 through bit lines BL0~BLN. During a read operation, the sense amplifier 200 provides the sensing current to the cell array 100 to read out data stored in a phase-change resistor PCR of a selected unit cell UC among the plurality of unit cells UC.

The phase-change memory device according to this embodiment of the present invention may further include a selector (not shown) provided between the sense amplifier/write driving unit 200 and the cell array 100 to select at least one unit cell UC among the plurality of unit cells UC.

The phase-change resistor PCR has resistance values corresponding to stored data values. For example, a lower resistance state may correspond to data of logic '1' and a higher resistance to data of logic '0'. When the sensing current supplied by the sense amplifier 200 passes through the phase-change resistor PCR, a sensing voltage is induced according to a resistance value of the phase-change resistor PCR. The sense amplifier 200 may discriminate which data is stored in the phase-change resistor PCR according to the sensing voltage.

In the same manner, during a write operation, the write driving unit 200 supplies the write current to the cell array 100 to write data into a phase-change resistor PCR of a selected unit cell UC among the plurality of unit cells UC. The phase-change resistor PCR has resistance values corresponding to stored data values. For example, a lower resistance state may correspond to data of logic '1' and a higher resistance to data of logic '0'.

The write driving unit 200 applies the write current to the phase-change resistor PCR to place the phase-change resistor PCR into a high resistance state or a low resistance state. As a result, data corresponding to a resistance value may be written into the phase-change resistor PCR.

Figure 10:
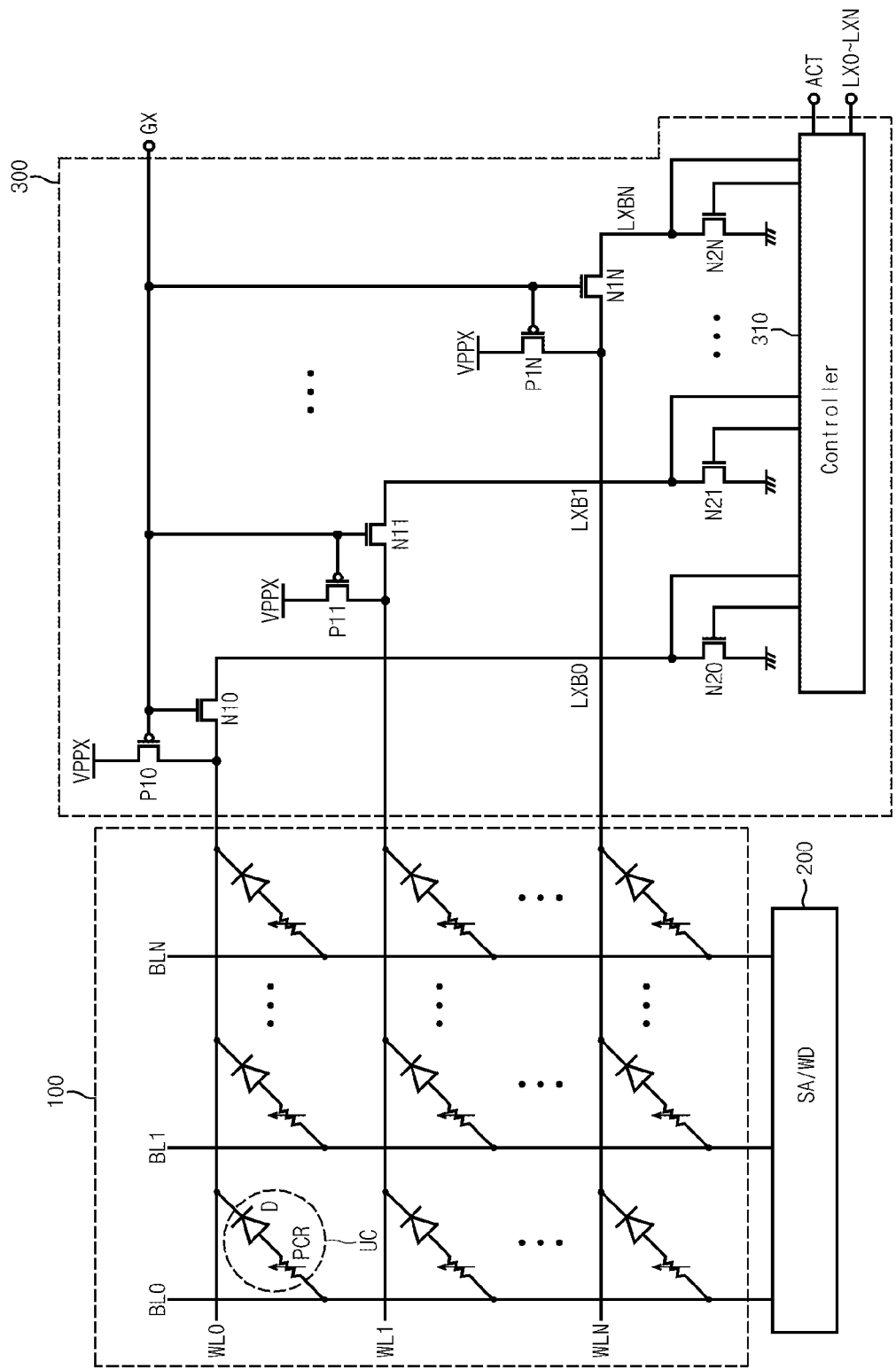
FIG. 10 is a circuit diagram illustrating a phase-change memory device according to an embodiment of the present invention.

FIG. 10 is a circuit diagram illustrating a phase-change memory device according to an embodiment of the present invention. Referring to FIG. 10, the phase-change memory device includes a cell array 100, a sense amplifier/write driving unit 200, and a switching unit 300.

In the cell array 100, bit lines BL0~BLN intersect word lines WL0~WLN, respectively. A plurality of unit cells UC are disposed at the intersections of the bit lines BL0~BLN and the word lines WL0~WLN. Each unit cell includes a phase-change resistor PCR and a switch element. The switch element may be a diode D. Connection relationships between the unit cell UC, the bit line BL and the word line WL are the same as those in FIG. 4.

The switching unit 300 controls operations of power supply elements P10~P1N and first switch elements N11~N1N according to a global line signal input through a global line GX, N being a positive integer. For example, each of the power supply elements is a PMOS transistor, and each of the first switch elements is an NMOS transistor. In this case, the global line signal is input to gates of the PMOS transistors P10~P1N and the NMOS transistors N10~N1N.

If the global line signal is activated to a high level in read/write modes, the PMOS transistors P10~P1N are turned-off not to supply the power source voltage VPPX to the word lines WL0~WLN, and the NMOS transistors N10~N1N are turned-on to connect the word lines WL0~WLN and their corresponding local line LXB0~LXBN.

When the global line signal is deactivated to a low level in a standby mode, the PMOS transistors P10~P1N are turned-on to supply the power source voltage VPPX to the word lines WL0~WLN, and the NMOS transistors N10~N1N are turned-off to cut off the connection between the word lines WL0~WLN and the local line LXB0~LXBN, respectively.

A controller 310 switches a plurality of second switch elements according to local line control signals LX0~LXN, respectively. The controller 310 supplies the power source voltage VPPX to the local lines LXB0~LXBN or floats the local lines LXB0~LXBN according to the local line control signals LX0~LXN and an active signal ACT.

For example, a second switch element may include an NMOS transistor. When the plurality of second switch elements corresponds to NMOS transistors N20~N2N, the NMOS transistors N20~N2N are turned-on or turned-off according to the local line control signals LX0~LXN, respectively.

When a specific local line control signal LX is input with a high level, a corresponding NMOS transistor is turned-on to connect a corresponding local line LXB with a ground terminal. Consequently, a current path for a sensing current or a write current flowing through a unit cell UC is formed.

If a specific local line control signal LX of a low level is input, a corresponding NMOS transistor N is turned-off to not connect the local line LXB to the ground terminal. In this case, the controller 310 supplies the power source voltage VPPX to the local line LXB or floats the local line LXB according to the active signal ACT.

For example, if the active signal ACT is activated in read/write modes, the controller 310 supplies the power source voltage VPPX to the local line LXB to prevent an electric current from being supplied from a non-selected unit cell UC. Conversely, if the active signal ACT is deactivated in a standby mode, the controller 310 floats all the local lines LXB0~LXBN to prevent a leakage current from being generated in the first switch elements N10~N1N.

Figure 11:
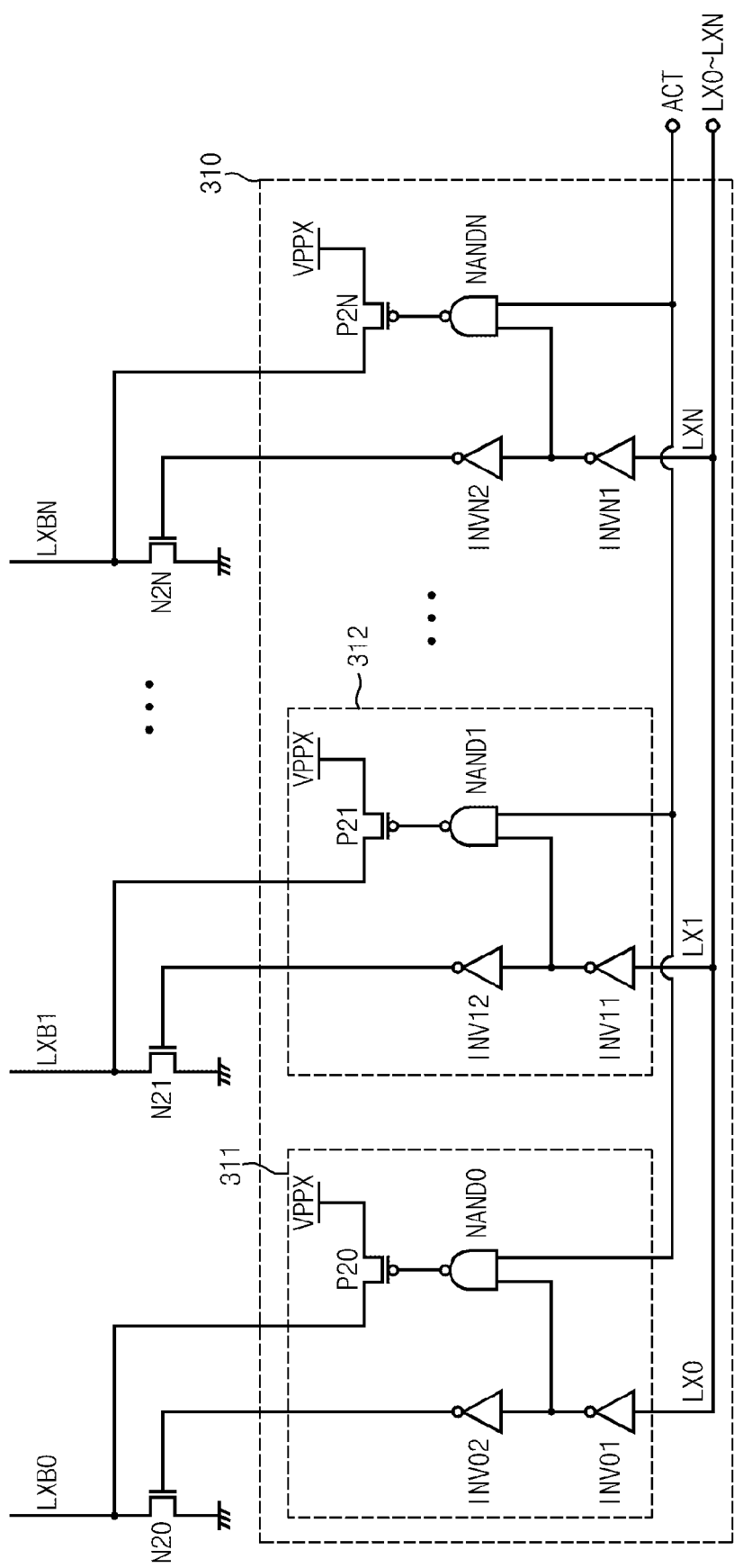
FIG. 11 is a circuit diagram illustrating a controller of the phase-change memory device shown in FIG. 10 according to an embodiment of the present invention.

FIG. 11 is a circuit diagram illustrating the controller 310 of the phase-change memory device according to an embodiment of the present invention. Referring to FIG. 11, the controller 310 includes a plurality of sub controllers 311, 312 and so on. Each sub controller 311, 312 and so on outputs signals to a plurality of second switch elements and local lines LXB0~LXBN according to an active signal ACT and local line control signals LX0~LXN.

For example, the sub controller 311 receives the active signal ACT and the local line control signal LX0. The local line control signal LX0 is inverted twice by a first inverter INV01 and a second inverter INV02 to be output to a gate of an NMOS transistor N20. When the local line control signal LX0 of a high level is input to the sub controller 311, the NMOS transistor N20 is turned-on to connect the local line LXB0 to a ground terminal. On the contrary, when the local line control signal LX0 of a low level is input to the sub controller 311, the NMOS transistor N20 is turned-off to cut off the connection between the local line LXB0 and the ground terminal.

The sub controller 311 includes a logic element. For example, the logic element may be a NAND gate NAND0.

If the active signal ACT of a low level is input thereto, the NAND gate NAND0 outputs a high level signal regardless of the local line control signal LX0. Consequently, a PMOS transistor P20 is turned-off. In this case, the power source signal VPPX cannot be supplied to the local line LXB0. In a standby mode, the local line control signal LX0 of a low level is input to the NMOS transistor N20, and thus the NMOS transistor N20 is turned-off. Accordingly, the active signal ACT of a low level may be input to float the local line LXB0.

Conversely, if the active signal ACT of a high level is input thereto, the NAND gate NAND0 outputs a high level signal or a low level signal according to the local line control signal LX0. If the local line control signal LX0 is input with a high level, the NAND gate NAND0 outputs a high level signal to turn-off the PMOS transistor P20. In this case, the power source signal VPPX cannot be supplied to the local line LXB0. On the other hand, if the local line LXB0 is input with a low level, the NAND gate NAND0 outputs a low level signal to turn-on the PMOS transistor P20. In this case, the power source signal VPPX is supplied to the local line LXB0.

Namely, the local line control signal LX0 is input with a high level in the read/write modes, a unit cell UC connected with a corresponding word line WL is selected. Conversely, the local line control signal LX0 is input with a low level in the read/write modes, a unit cell UC connected with the corresponding word line WL is not selected.

In this case, a sensing current or a write current passing through a unit cell UC selected in the read/write modes flows to the ground terminal through the local line LXB0. Conversely, since the power source signal VPPX is supplied to a local line LXB corresponding to a non-selected unit cell UC, a sensing current or a write current cannot flow to the ground terminal. As a result, the read/write operations can be performed on the selected unit cell among the plurality of unit cells.

Figure 12:
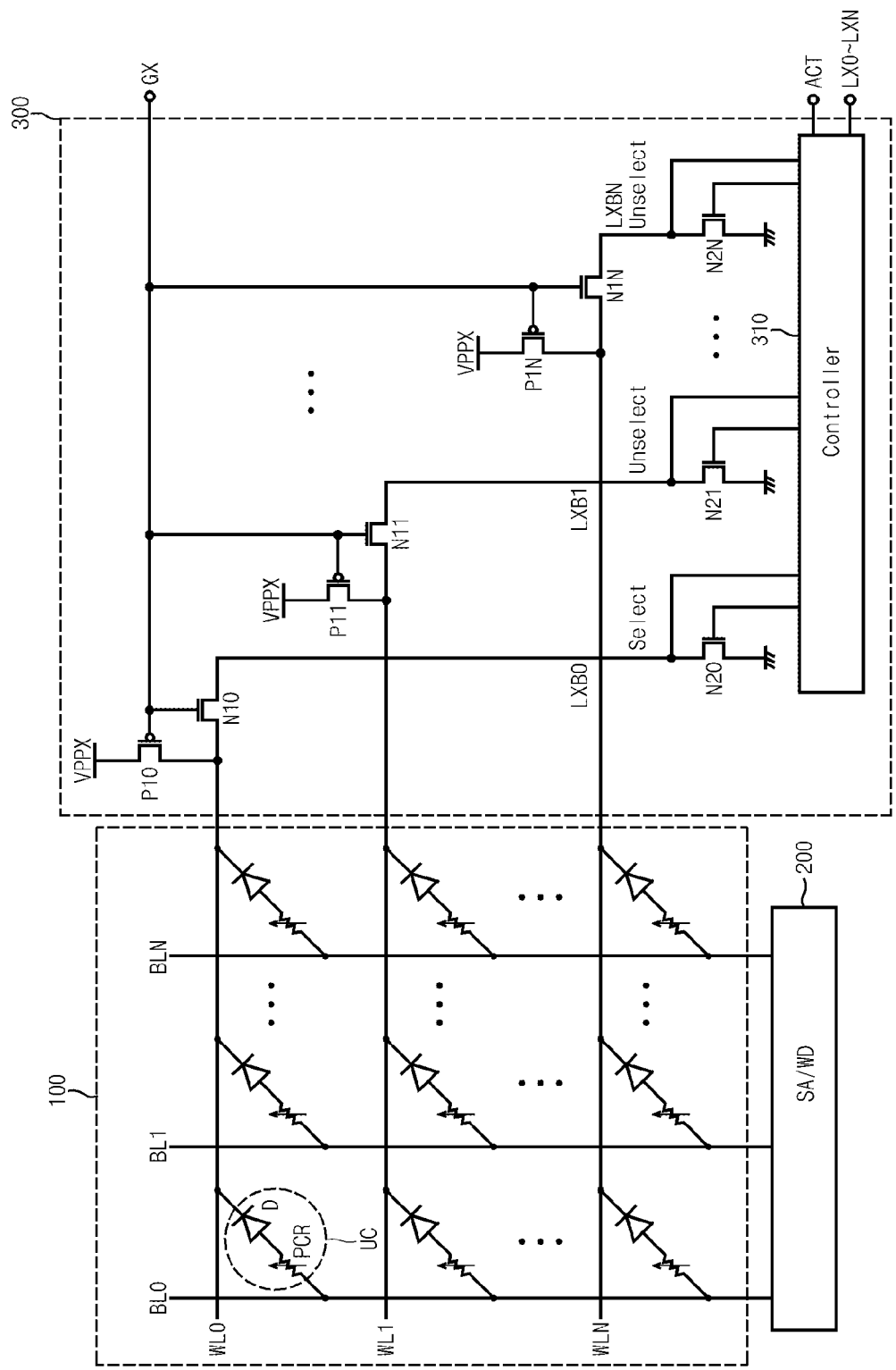
FIG. 12 is a circuitry diagram illustrating an operation of the phase-change memory device shown in FIG. 10.

FIG. 12 is a circuit diagram illustrating an operation of the phase-change memory device shown in FIG. 10. Referring to FIG. 12, in the phase-change memory device, unit cells connected to a word line WL0 are selected but unit cells connected to word lines WL1~WLN are not selected.

Referring back to FIG. 11, to select the word line WL0, a current path should be formed from the word line WL0 to the ground terminal through the local line LXB0. In this case, the local line control signal LX0 of a high level is input to turn-on the NMOS transistor N20 that is the second switch element. A current path should not be formed from word lines WL1~WLN to the ground terminal through local lines LXB1~LXBN not to select the word lines WL1~WLN. In this case, the local line control signals LX1~LXN are input with a low level to turn-off the NMOS transistors N21~N2N that are the second switch elements.

In the read/write modes, when the global line signal is activated to turn-on the first switch element, a sensing current or a write current from a selected unit cell UC flows to the ground terminal through the word line WL0 and the local line LXB0. As described above, the sense amplifier/write driving unit 200 performs sensing/write operations according to the sensing current or the write current.

Meanwhile, although the global line signal is activated and thus first switch elements connected to non-selected cells are turned-on in response to the global line signal, because the power source voltage VPPX is supplied to the local lines LXB1~LXBN in a state where the second switch element is turned-off, a current path cannot be formed.

In a standby mode, the global line signal is deactivated to turn-off all of the first switch elements. Since read/write operations are not performed in the standby mode, the cell selection is unnecessary. Accordingly, all the local line control signals LX0~LXN are input with a low level, and thus all of the plurality of second switch elements are turned-off. In this case, the controller 310 may float all the local lines LXB0~LXBN to prevent a leakage current from being generated in the first switch element.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A phase-change memory device, comprising:
   a unit cell including a phase-change resistor;
   a sense amplifier configured to apply a sensing signal to the unit cell; and
   a switching unit configured to operate in a standby mode or a read mode according to a global line signal and control whether or not the sensing signal passes through the unit cell according to a state of an active signal in the standby mode,
   wherein the switching unit comprises:
      a first switch element configured to operate according to the global line signal, a first terminal of the first switch element being coupled to the unit cell, and a second terminal of the first switch element being coupled to a ground terminal; and
      a second switch element configured to operate according to a local line signal, a first terminal of the second switch element being coupled to the second terminal of the first switch element, and a second terminal of the second switch element being coupled to the ground terminal, and
   wherein the switching unit is configured to not allow the sensing signal to pass when the active signal is deactivated and the first switch element is turned off in the standby mode.

2. The phase-change memory device of claim 1, wherein the sensing signal is current based.

3. The phase-change memory device of claim 1, wherein the switching unit further comprises a controller configured to float the second terminal of the first switch element in the standby mode.

4. The phase-change memory device of claim 3, wherein the controller supplies a power source voltage to the second terminal of the first switch element in the read mode.

5. The phase-change memory device of claim 1, wherein the second switch element is turned-off in the standby mode.

6. The phase-change memory device of claim 5, wherein the second switch element is turned-on in the read mode.

7. The phase-change memory device of claim 1, wherein the unit cell comprises a switch element for switching the sensing signal applied from the sense amplifier, the sensing signal being a sensing current.

8. The phase-change memory device of claim 7, wherein the switch element includes a diode, the diode being configured to define a direction from the sense amplifier to the switching unit to be a forward direction.

9. A phase-change memory device, comprising:
   a unit cell including a phase-change resistor;
   a write driving unit configured to apply a write signal to the unit cell; and
   a switching unit configured to operate in a standby mode or a write mode according to a global line signal and control whether or not the write signal passes through the unit cell according to a state of an active signal in the standby mode,
   wherein the switching unit comprises:
      a first switch element configured to operate according to the global line signal, a first terminal of the first switch element being coupled to the unit cell, and a second terminal of the first switch element being coupled to a ground terminal; and
      a second switch element configured to operate according to a local line signal, a first terminal of the second switch element being coupled to the second terminal of the first switch element, and a second terminal of the second switch element being coupled to the ground terminal, and
   wherein the switching unit is configured to not allow the write signal to pass when the active signal is deactivated and the first switch element is turned off in the standby mode.

10. The phase-change memory device of claim 9, wherein the write signal is current based.

11. The phase-change memory device of claim 9, wherein the switching unit further comprises a controller configured to float the second terminal of the first switch element in the standby mode.

12. The phase-change memory device of claim 11, wherein the controller is configured to supply a power source voltage to the second terminal of the first switch element in the write mode.

13. The phase-change memory device of claim 9, wherein the second switch element is turned-off in the standby mode.

14. The phase-change memory device of claim 13, wherein the second switch element is turned-on in the write mode.

15. The phase-change memory device of claim 9, wherein the unit cell comprises a switch element for switching the write signal applied from the write driving unit.

16. The phase-change memory device of claim 15, wherein the switch element includes a diode, the diode being configured to define a direction from the write driving unit to the switching unit to be a forward direction.

17. A phase-change memory device, comprising:
   a cell array including a plurality of unit cells;
   a sense amplifier configured to apply a sensing signal to at least one unit cell selected among the plurality of unit cells; and
   a switching unit configured to operate in a standby mode or a read mode according to a global line signal and control whether or not the sensing signal passes through the selected unit cell according to a state of an active signal in the standby mode,
   wherein the switching unit comprises:
      a plurality of first switch elements configured to operate according to the global line signal, a first terminal of each of the first switch elements being coupled to the cell array, a second terminal of each of the first switch elements being coupled to a ground terminal; and
      a plurality of second switch elements configured to operate according to local line control signals, a first terminal of each of the second switch elements being coupled to the second terminal of a corresponding one of the first switch elements, and a second terminal of each of the second switch elements being coupled to the ground terminal, and
   wherein the switching unit is configured to not allow the sensing signal to pass when the active signal is deactivated and the plurality of first switch elements are turned off in the standby mode.

18. The phase-change memory device of claim 17, wherein the switching unit comprises a controller configured to select at least one unit cell among the plurality of unit cells according to the local line control signals, and wherein the sensing signal is current based.

19. The phase-change memory device of claim 17, wherein the controller is configured to float the second terminals of the plurality of first switch elements in the standby mode.

20. The phase-change memory device of claim 19, wherein the controller is configured to supply a power source voltage to the second terminals of the first switch elements corresponding to non-selected unit cells among the plurality of unit cells in the read mode, respectively.

21. The phase-change memory device of claim 17, wherein the plurality of second switch elements are turned-off in the standby mode.

22. The phase-change memory device of claim 17, wherein each of the unit cells comprises a switch element for switching the sensing signal applied from the sense amplifier.

23. The phase-change memory device of claim 22, wherein the switch element includes a diode, the diode being configured to define a direction from the sense amplifier to the switching unit to be a forward direction.

24. A phase-change memory device, comprising:
a cell array including a plurality of unit cells;
a write driving unit configured to apply a write signal to at least one unit cell selected among the plurality of unit cells; and
a switching unit configured to operate in a standby mode or a write mode according to a global line signal and control whether or not the write signal passes through the selected unit cell according to an active signal in the standby mode,
wherein the switching unit comprises:
a plurality of first switch elements configured to operate according to the global line signal, a first terminal of each of the first switch elements being coupled to the cell array, and a second terminal of each of the first switch elements being coupled to a ground terminal; and
a plurality of second switch elements configured to operate according to local line control signals, a first terminal of each of the second switch elements being coupled to the second terminal of a corresponding one of the first switch elements, and a second terminal of each of the second switch elements being coupled to the ground terminal, and
wherein the switching unit is configured to not allow the write signal to pass when the active signal is deactivated and the plurality of first switch elements are turned off in the standby mode.

25. The phase-change memory device of claim 24, wherein the switching unit comprises a controller configured to select at least one unit cell among the plurality of unit cells according to the local line control signals.

26. The phase-change memory device of claim 24, wherein the controller is configured to float the second terminals of the plurality of first switch elements in the standby mode.

27. The phase-change memory device of claim 26, wherein the controller is configured to supply a power source voltage to the second terminals of the first switch elements corresponding to non-selected unit cells among the plurality of unit cells in the write mode, respectively.

28. The phase-change memory device of claim 24, wherein the plurality of second switch elements are turned-off in the standby mode.

29. The phase-change memory device of claim 24, wherein each of the unit cells comprises a switch element for switching the write signal applied from the write driving unit.

30. The phase-change memory device of claim 29, wherein the switch element includes a diode, the diode being configured to define a direction from the write driving unit to the switching unit to be a forward direction.

* * * * *